(12) United States Patent
Lee et al.

(10) Patent No.: US 10,930,887 B2
(45) Date of Patent: Feb. 23, 2021

(54) FLEXIBLE ORGANIC LIGHT EMITTING DISPLAY DEVICE HAVING A DAM IN A FOLDING REGION

(71) Applicant: LG Display Co., Ltd., Seoul (KR)

(72) Inventors: Jae-Young Lee, Gyeonggi-do (KR); Ji-Min Kim, Seoul (KR); Gi-Youn Kim, Gyeonggi-do (KR); Sang-Hoon Oh, Jeollabuk-do (KR); Wan-Soo Lee, Jeollabuk-do (KR)

(73) Assignee: LG Display Co., Ltd., Seoul (KR)

( * ) Notice: Subject to any disclaimer, the term of this patent is extended or adjusted under 35 U.S.C. 154(b) by 45 days.

(21) Appl. No.: 16/256,502

(22) Filed: Jan. 24, 2019

(65) Prior Publication Data

US 2019/0157619 A1 May 23, 2019

Related U.S. Application Data

(63) Continuation of application No. 15/292,545, filed on Oct. 13, 2016, now Pat. No. 10,263,217.

(30) Foreign Application Priority Data

Oct. 28, 2015 (KR) .................. 10-2015-0150153

(51) Int. Cl.
*H01L 51/52* (2006.01)
*H01L 27/32* (2006.01)
(Continued)

(52) U.S. Cl.
CPC ...... *H01L 51/5259* (2013.01); *H01L 27/3246* (2013.01); *H01L 51/0097* (2013.01);
(Continued)

(58) Field of Classification Search
CPC ............. H01L 27/3258; H01L 51/5253; H01L 51/5259; H01L 51/0097; H01L 51/5246;
(Continued)

(56) References Cited

U.S. PATENT DOCUMENTS 10,263,217 B2 * 4/2019 Lee .................. H01L 27/3246
2013/0002133 A1 1/2013 Jin et al.
(Continued)

FOREIGN PATENT DOCUMENTS

CN 104012173 A 8/2014
CN 104124258 A 10/2014
(Continued)

OTHER PUBLICATIONS

Chinese Office Action dated Feb. 14, 2019, issued by the Chinese Patent Office for counterpart Chinese Patent Application No. 201610890928.0.

*Primary Examiner* — Lex H Malsawma
*Assistant Examiner* — Eric W Jones
(74) *Attorney, Agent, or Firm* — Morgan, Lewis & Bockius LLP

(57) ABSTRACT

A flexible organic light emitting display (OLED) device includes a flexible substrate having a display area, a non-display area at a periphery of the display area and a folding region; at least one organic emitting diode on the flexible substrate in the display area; an encapsulation film covering the organic emitting diode; and a dam on the flexible substrate. The dam laterally surrounds the display area and includes: a first dam in the folding region; and a second dam outside the folding region, wherein the average thickness of the first dam is smaller than the average thickness of the second dam.

20 Claims, 11 Drawing Sheets

(51) Int. Cl.
*H01L 51/00* (2006.01)
*H01L 51/56* (2006.01)

(52) U.S. Cl.
CPC ...... *H01L 51/5246* (2013.01); *H01L 51/5256* (2013.01); *H01L 51/56* (2013.01); *H01L 2251/5338* (2013.01); *Y02E 10/549* (2013.01); *Y02P 70/50* (2015.11)

(58) Field of Classification Search
CPC . H01L 51/5256; H01L 51/56; H01L 27/3246; H01L 2251/5338; Y02P 70/50; Y02E 10/549
USPC ..................................... 257/40, 59; 438/149
See application file for complete search history.

(56) References Cited

U.S. PATENT DOCUMENTS

| | | |
|---|---|---|
| 2014/0061624 A1 | 3/2014 | Nagata et al. |
| 2014/0118975 A1 | 5/2014 | Chen et al. |
| 2014/0160710 A1 | 6/2014 | Yan et al. |
| 2014/0168090 A1 | 6/2014 | Aaltonen et al. |
| 2014/0300270 A1 | 10/2014 | Sakamoto |
| 2014/0319474 A1 | 10/2014 | Kim et al. |
| 2015/0060806 A1 | 3/2015 | Park et al. |
| 2015/0155520 A1 | 6/2015 | Kim et al. |
| 2015/0188082 A1 | 7/2015 | Rohatgi |
| 2015/0380685 A1 | 12/2015 | Lee et al. |
| 2016/0064686 A1 | 3/2016 | Odaka et al. |
| 2016/0204373 A1 | 7/2016 | Park |
| 2016/0260928 A1 | 9/2016 | Choi et al. |
| 2016/0270209 A1 | 9/2016 | Cho |
| 2016/0365395 A1 | 12/2016 | Xu et al. |
| 2018/0013079 A1 | 1/2018 | Cai |

FOREIGN PATENT DOCUMENTS

| | | |
|---|---|---|
| CN | 104854534 A | 8/2015 |
| CN | 104900681 A | 9/2015 |
| CN | 104934438 A | 9/2015 |
| KR | 10-2009-0073478 A | 7/2009 |

* cited by examiner

FLEXIBLE ORGANIC LIGHT EMITTING DISPLAY DEVICE HAVING A DAM IN A FOLDING REGION

CROSS-REFERENCE TO RELATED APPLICATIONS

The present application claims the benefit of Korean Patent Application No. 10-2015-0150153 filed in the Republic of Korea on Oct. 28, 2015, which is hereby incorporated by reference.

BACKGROUND

Field of Technology

The present disclosure relates to an organic light emitting display (OLED) device, and more particularly, to a flexible OLED device.

Discussion of the Related Art

As information technology and mobile communication technology have been developed, a display device capable of displaying a visual image has also been developed. Flat panel display devices, such as a liquid crystal display (LCD) device and an OLED device, are developed and used.

Among these flat panel display devices, since the OLED device has advantages in response time, contrast ratio, viewing angle, power consumption, and so on, the OLED device is widely developed.

An emitting diode including an organic emitting layer is susceptible to damage from moisture. To prevent moisture penetration into the emitting diode and protect the emitting diode from external impacts, an encapsulation substrate of glass is attached onto the emitting diode.

Recently, foldable, bendable or rollable display devices (hereinafter "flexible display device") have been introduced.

In the flexible OLED device, an encapsulation film including an inorganic layer and an organic layer is used instead of the encapsulation substrate of glass. Namely, by using the encapsulation film for preventing moisture penetration into the emitting diode and to protect the emitting diode, the display device has a flexible property.

FIG. 1 is a cross-sectional view of the related art flexible OLED device.

Referring to FIG. 1, the related art flexible OLED device 1 includes a flexible substrate 10, an organic emitting diode D and an encapsulation film 20. A display area AA and a non-display area NA at a periphery of the display area AA are defined on the flexible substrate 10, and the organic emitting diode D is disposed on the flexible substrate 10. The encapsulation film 20 covers the organic emitting diode D.

The organic emitting diode D is disposed in the display area AA, and a driving part (not shown) driving the organic emitting diode D is disposed in the non-display area NA.

Although not shown, the organic emitting diode D includes first and second electrodes, which faces each other, and an organic emitting layer therebetween. In addition, a switching thin film transistor (TFT) as a switching element and a driving TFT as a driving element are formed in each pixel region on the flexible substrate 10, and the first electrode of the organic emitting diode D is connected to the driving TFT.

The encapsulation film 20 covers the organic emitting diode D and corresponds to the display area AA and the non-display area NA, in particular, overlaps both the display area AA and the non-display area NA. The damages on the organic emitting diode D in a condition of high temperature and high humidity are prevented by the encapsulation film 20.

An inorganic layer and an organic layer are alternately stacked to form the encapsulation film 20. For example, the encapsulation film 20 may have a triple-layered structure of a first inorganic layer 22 on the organic emitting diode D, an organic layer 24 on the first inorganic layer 22 and a second inorganic layer 26 on the organic layer 24.

However, when the flexible OLED device is operated under a condition of high temperature and high humidity, the emitting diode is still damaged resulting in problems in display quality and a lifetime of the flexible OLED device.

SUMMARY

Accordingly, the present invention is directed to a flexible OLED device that substantially obviates one or more of the problems due to limitations and disadvantages of the related art.

An object of the present invention is to provide a flexible OLED device that can operate at conditions of high temperature and high humidity.

Another object of the present invention is to provide a flexible OLED device that has a high display quality and long lifetime.

Another object of the present invention is to provide a flexible OLED device that can be easily manufactured with a low cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a flexible OLED device comprises a flexible substrate including a display area, a non-display area at a periphery of the display area and a folding region, at least one organic emitting diode on the flexible substrate in the display area; an encapsulation film covering the organic emitting diode, a dam on the flexible substrate, wherein the dam laterally surrounds the display area and comprises a first dam in the folding region and a second dam outside the folding region, wherein the average thickness of the first dam is smaller than the average thickness of the second dam.

In another aspect, a method for manufacturing a flexible OLED device comprises providing a flexible substrate including a display area, a non-display area at a periphery of the display area and a folding region, forming a dam surrounding the display area on the flexible substrate, wherein the dam comprises a first dam in the folding region and a second dam outside the folding region, wherein the average thickness of the first dam is smaller than the average thickness of the second dam, forming an emitting diode within the display area, covering the display area and the non-display area with a first inorganic layer, and covering the display area with an organic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments, examples of which are illustrated in the accompanying drawings.

Figure 1:
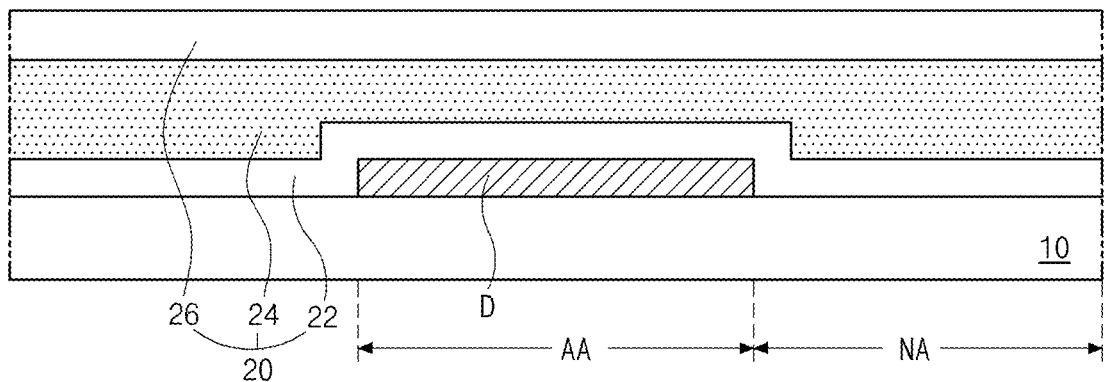
FIG. 1 is a cross-sectional view of the related art flexible OLED device.
Figure 2:
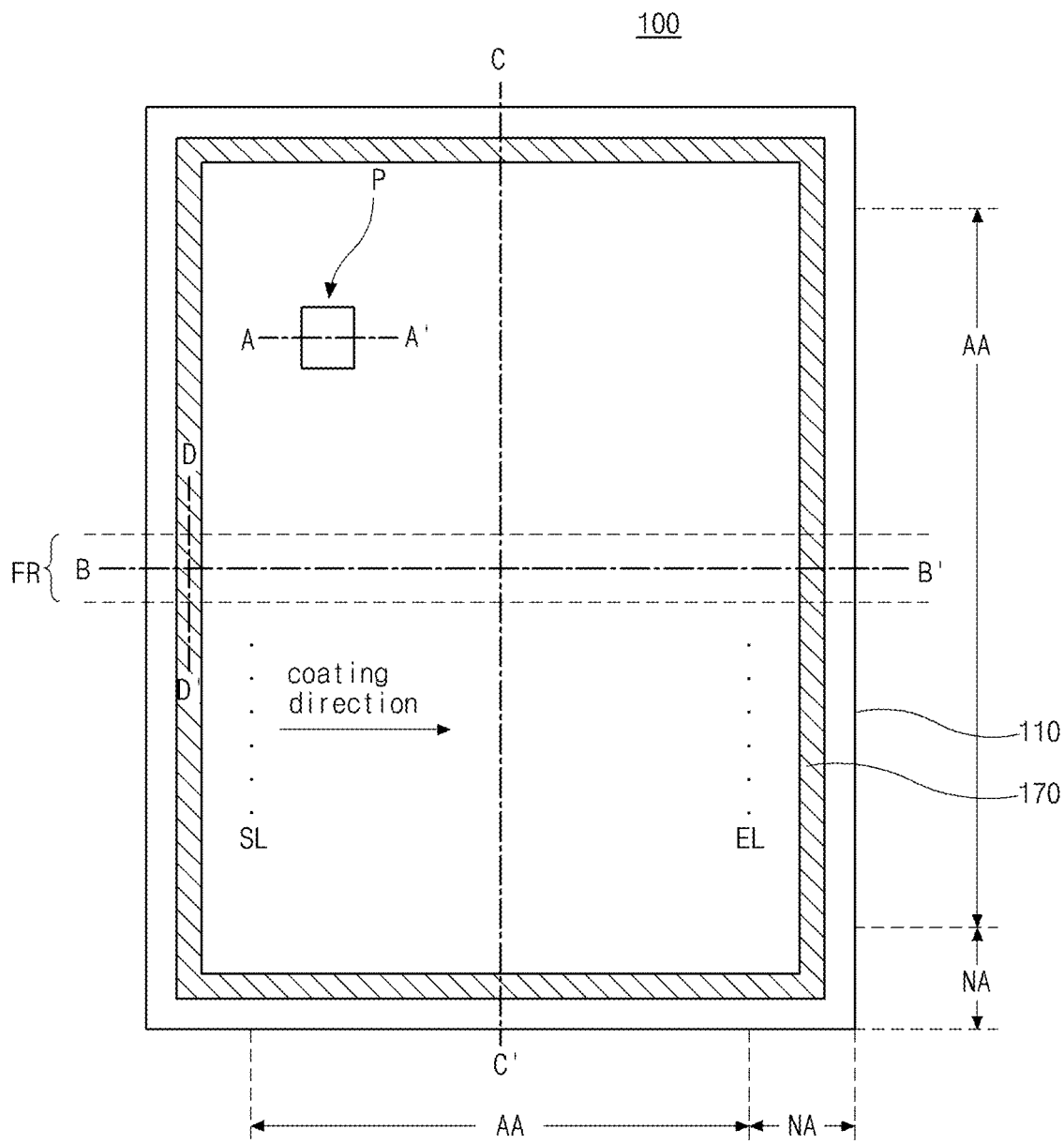
FIG. 2 is plane view illustrating a flexible OLED device according to first to fifth embodiments of the present invention.

FIG. 2 is plane view illustrating first to fifth embodiments of a flexible OLED device.

As shown in FIG. 2, an OLED device 100 of the present invention is a flexible display device being foldable, bendable or rollable along a folding region FR. For example, the folding region FR is defined along a minor axis of the flexible OLED device 100. Alternatively, the folding region FR may be defined along a major axis of the flexible OLED device 100.

When the folding region FR is defined along the minor axis as shown in FIG. 2, a pad region (not shown) may be defined at at least one end of the major axis. In an alternative embodiment (not shown), if the folding region FR is defined along the major axis, the pad region may be defined at at least one end of the minor axis.

In the flexible OLED device 100, a plurality of pixel regions P are defined in a display area AA on the flexible substrate 100, and an organic emitting diode (not shown) is formed in each pixel region P.

In addition, a dam 170 is formed at a non-display area NA, which is defined as a region at a periphery of the display area AA, to surround the display area AA.

Moreover, an encapsulation film (not shown) covering the organic emitting diode and the dam 170 is formed. Namely, the encapsulation film corresponds to the display area AA and the non-display area NA, in particular overlaps the display area AA and the non-display area NA.

For example, the encapsulation film may have a triple-layered structure of a first inorganic layer, an organic layer on the first inorganic layer and a second inorganic layer on the organic layer. In this instance, the organic layer is disposed inside the dam 170, and the first and second inorganic layers are disposed to cover the dam 170. As a result, moisture penetration into the display area through a side of the organic layer of the encapsulation film is prevented.

Flow of the organic material, which is coated by a coating process, may be blocked by the dam 170 such that the organic layer 182 is formed inside the dam 170. Accordingly, the side surface of the organic layer 182 is not exposed such that problems in display quality and a lifetime of the flexible OLED device by moisture penetration may be prevented.

Figure 3:
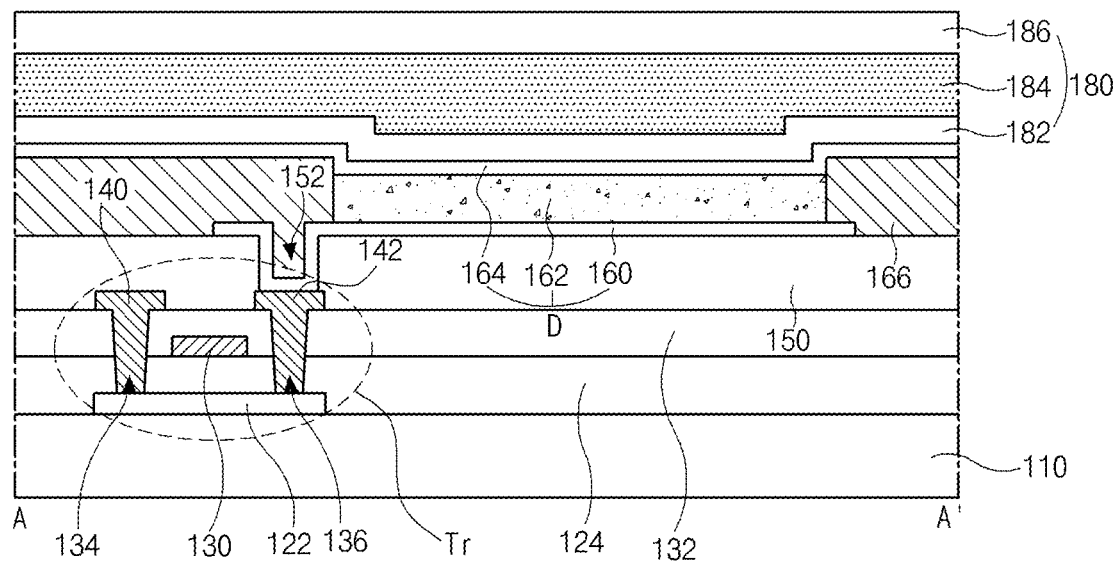
FIG. 3 is a cross-sectional view taken along the line A-A' of FIG. 2 and illustrating a flexible OLED device according to the first to third embodiments of the present invention.

FIG. 3 is a cross-sectional view taken along the line A-A' of FIG. 2 and illustrating a flexible OLED device according to the first to third embodiments.

As shown in FIG. 3, the TFT Tr, the organic emitting diode D and the encapsulation film 180 are stacked over the flexible substrate 110.

For example, the flexible substrate 110 may be a substrate formed of a polymer, in particular, polyimide. For fabrication, a carrier substrate (not shown) may be attached to a lower surface of the flexible substrate 110, elements such as the TFT Tr may be formed on the flexible substrate 110, and the carrier substrate is released from the flexible substrate 110. Thus, the carrier substrate may facilitate fabrication of the TFT Tr.

The TFT Tr is formed on the flexible substrate 110. Although not shown, a buffer layer may be formed on the flexible substrate 110, and the TFT Tr may be formed on the buffer layer.

A semiconductor layer 122 is formed on the flexible substrate 110. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122.

The light to the semiconductor layer 122 may be shielded or blocked by the light-shielding pattern such that thermal degradation of the semiconductor layer 122 can be prevented. When the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 above a center of the semiconductor layer 122.

In FIG. 3, the gate insulating layer 124 is formed on the entire surface of the flexible substrate 110. Alternatively, the gate insulating layer 124 may be patterned to have the same shape or a similar shape as the gate electrode 130.

An interlayer insulating layer 132, which is formed of an insulating material, is formed on an entire surface of the flexible substrate 110 including the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

In FIG. 3, the first and second contact holes 134 and 136 extend into the gate insulating layer 124. Alternatively, when the gate insulating layer 124 is patterned to have the same shape as the gate electrode 130, the first and second contact holes 134 and 136 are formed only through the interlayer insulating layer 132 and not through the gate insulating layer 124.

A source electrode 140 and a drain electrode 142, which are formed of a conductive material, e.g., metal, are formed on the interlayer insulating layer 132. The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr, and the TFT Tr serves as a driving element.

In FIG. 3, the gate electrode 130, the source electrode 140 and the drain electrode 142 are positioned over the semiconductor layer 122. Namely, the TFT Tr has a coplanar structure. Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the flexible substrate 110 and cross each other to define a pixel region. In addition, a switching element, which is electrically connected to the gate line and the data line, may be disposed on the flexible substrate 110. The switching element is electrically connected to the TFT Tr as the driving element.

In addition, a power line, which is parallel to and spaced apart from the gate line or the data line, may be formed on or over the flexible substrate 110. Moreover, a storage capacitor for maintaining a voltage of the gate electrode 130 of the TFT Tr during one frame, may be further formed on the flexible substrate 110.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel region. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the organic emitting diode D is operated in a top-emission type, a reflection electrode or a reflection layer may be formed under the first electrode 160. For example, the reflection electrode or the reflection layer may be formed of aluminum-paladium-copper (APC) alloy.

A bank layer 166, which covers edges of the first electrode 160, is formed on the passivation layer 150. A center of the first electrode 160 in the pixel region is exposed through an opening of the bank layer 166.

An organic emitting layer 162 is formed on the first electrode 160. The organic emitting layer 162 may have a single-layered structure of an emitting material layer formed of an emitting material. Alternatively, to improve emitting efficiency, the organic emitting layer 162 may have a multi-layered structure including a hole injection layer, a hole transporting layer, the emitting material layer, an electron transporting layer and an electron injection layer sequentially stacked on the first electrode 160.

A second electrode 164 is formed over the flexible substrate 110 including the organic emitting layer 162. The second electrode 164 is positioned at an entire surface of the display area. The second electrode 164 may be a cathode. The second electrode 164 may be formed of a conductive material having a a lower work function than the first electrode 160. For example, the second electrode 164 may be formed of aluminum (Al), magnesium (Mg) or Al—Mg alloy.

The first electrode 160, the organic emitting layer 162 and the second electrode 164 constitute the organic emitting diode D.

An encapsulation film 180 is formed on the organic emitting diode D to prevent penetration of moisture into the organic emitting diode D. The encapsulation film 180 may have has a triple-layered structure of a first inorganic layer 182, an organic layer 184 and a second inorganic layer 186. However, it is not limited thereto.

For example, the encapsulation film 180 may further include an organic layer on the second inorganic layer 186 or an organic layer and an inorganic layer stacked on the second inorganic layer 186.

The first inorganic layer 182 contacts and covers the organic emitting diode D. For example, the first inorganic layer 182 may be formed of one of silicon oxide (SiOx), silicon nitride (SiNx) and silicon-oxy-nitride (SiON).

The organic layer 184 is formed on the first inorganic layer 182. The stress to the first inorganic layer 182 may be reduced by the organic layer 184. For example, the organic layer 182 may be formed of an acryl-based material or an epoxy-based material.

The second inorganic layer 186 is formed on the organic layer 184 and may be formed of one of silicon oxide (SiOx), silicon nitride (SiNx) and silicon-oxy-nitride (SiON).

For example, each of the first and second inorganic layers 182 and 186 may be formed by a plasma enhanced chemical vapor deposition (PECVD) process or an atomic layer deposition (ALD) process, and the organic layer 184 may be formed by an inkjet coating process, a slit coating process or a bar coating process.

Although not shown, a barrier film may be attached to the encapsulation film 180, and a polarization plate for reducing an ambient light reflection may be attached to the barrier film. For example, the polarization plate may be a circular polarization plate.

Figure 4:
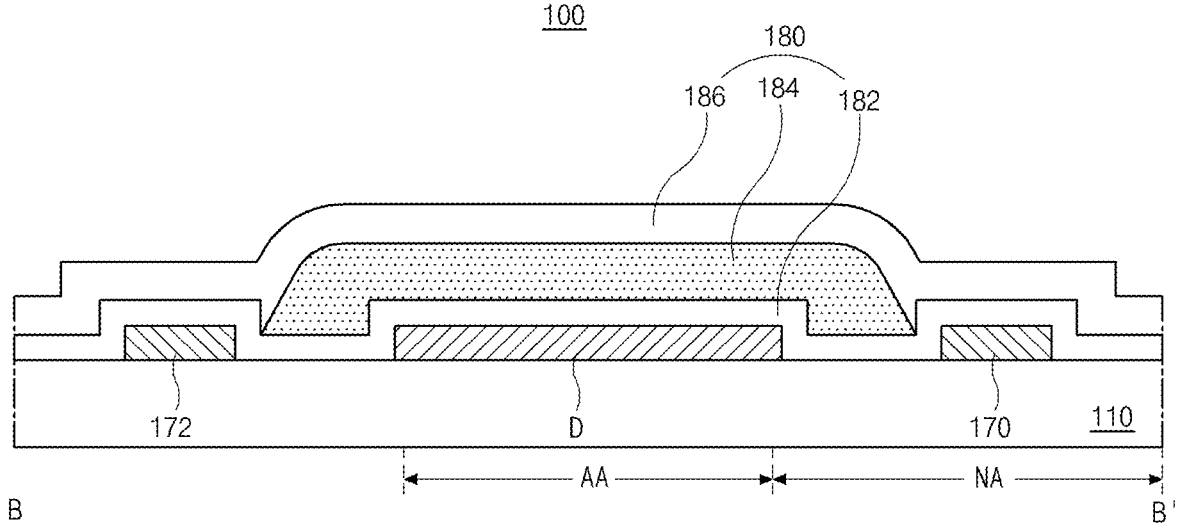
FIG. 4 is a cross-sectional view taken along the line B-B' of FIG. 2 and illustrating a flexible OLED device according to the first embodiment of the present invention.

FIG. 4 is a cross-sectional view taken along the line B-B' of FIG. 2 and illustrating a flexible OLED device according to the first embodiment.

As shown in FIG. 4, the organic emitting diode D is formed in the display area AA of the flexible substrate 110, and the dam 170 is formed in the non-display area NA of the flexible substrate 110 to surround the display area AA.

The dam 170 has a pre-determined thickness and is positioned to be spaced apart from the organic emitting diode D. The dam 170 may be formed of the same material and formed at the same layer as the bank layer 166. For example, the dam 170 may be formed of an inorganic material, such as silicon oxide or silicon nitride, or an organic material such as polyimide.

In addition, the encapsulation film 180 is formed to cover the organic emitting diode D and the dam 170. As mentioned above, the encapsulation film 180 may include the first inorganic layer 182, the organic layer 184 and the second inorganic layer 186.

The first and second inorganic layers 182 and 186 cover the organic emitting diode D and the dam 170, and the organic layer 184 is positioned inside the area surrounded by the dam 170. Namely, the organic layer 184 covers the organic emitting diode D and does not overlap the dam 170. In other words, the organic layer 184 has a width or a plane area being smaller than each of the first and second inorganic layers 182 and 186.

When the organic material is coated to form the organic layer 184 after the first inorganic layer 182 is deposited, the flow of the organic material is blocked by the dam 170 such that the organic layer 184 is formed inside the area defined by the dam 170. Accordingly, the side surface of the organic layer 184 is completely covered by the second inorganic layer 186 such that the moisture penetration through the side surface of the organic layer 184 is prevented.

The dam 170 has the substantially same height or thickness at the four sides of the flexible substrate 110.

Figure 5:
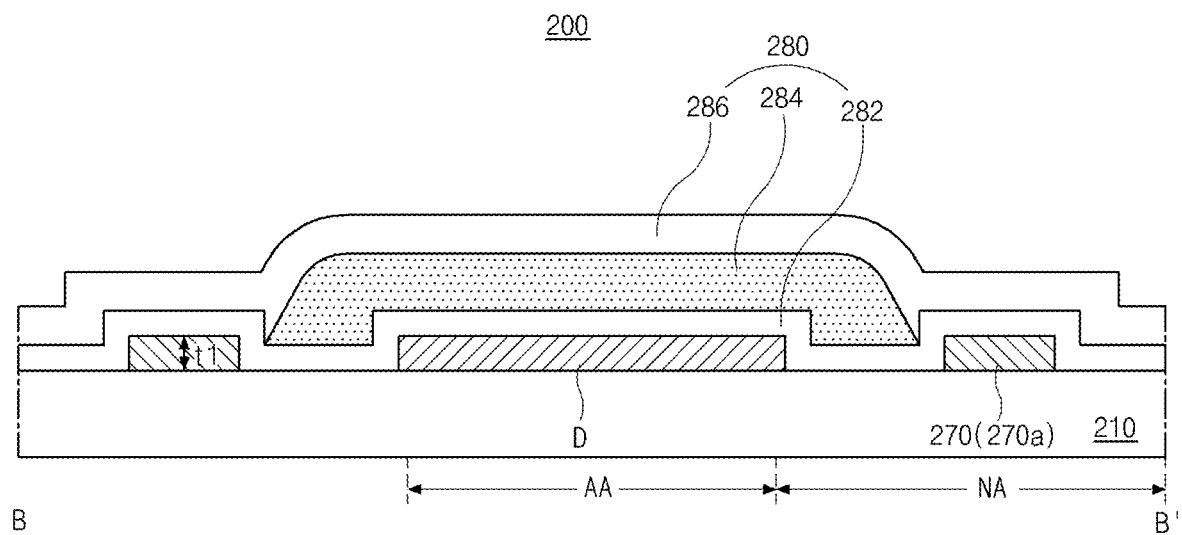
FIG. 5 is a cross-sectional view taken along the line B-B' of FIG. 2 and illustrating a flexible OLED device according to the second and third embodiments of the present invention.
Figure 6:
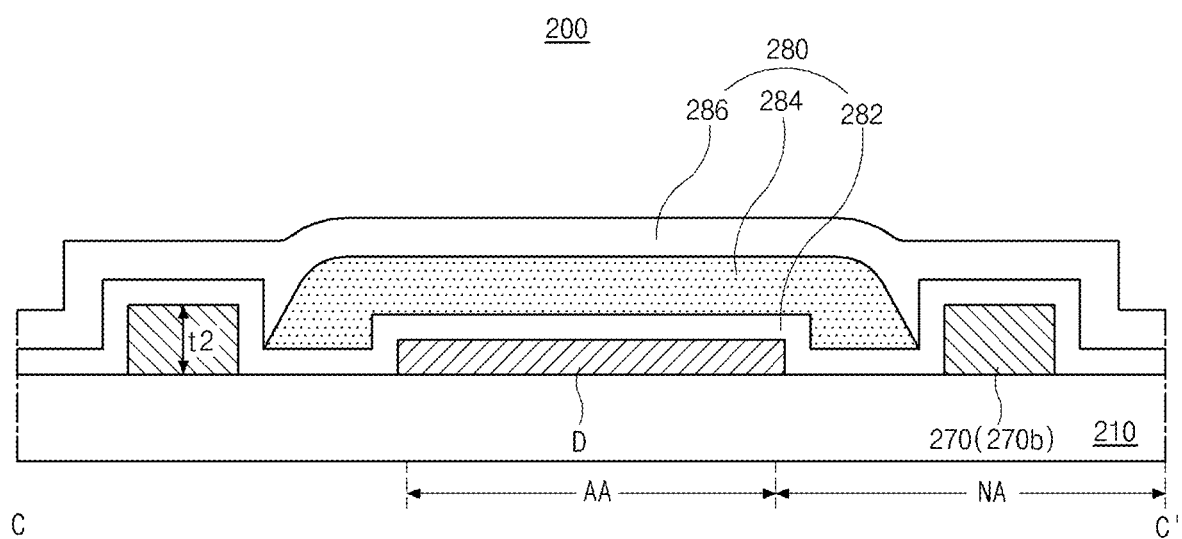
FIG. 6 is a cross-sectional view taken along the line C-C' of FIG. 2 and illustrating a flexible OLED device according to the second and third embodiments of the present invention.

FIG. 5 is a cross-sectional view taken along the line B-B' of FIG. 2 and illustrating a flexible OLED device according to the second and third embodiments. FIG. 6 is a cross-sectional view taken along the line C-C' of FIG. 2 and illustrating a flexible OLED device according to the second and third embodiments.

As shown in FIGS. 5 and 6, the organic emitting diode D is formed in the display area AA of the flexible substrate 210, and the dam 270 is formed in the non-display area NA of the flexible substrate 210 to surround the display area AA. For example, the dam 270 may be formed of an inorganic material, such as silicon oxide or silicon nitride, or an organic material such as polyimide.

As explained through FIG. 3, the TFT Tr including the semiconductor layer 122, the gate electrode 130, the source electrode 140 and the drain electrode 142 is formed on the flexible substrate 110, and the organic emitting diode D includes the first electrode 160, which is connected to the drain electrode 142 of the TFT Tr, the second electrode 164, which faces the first electrode 160, and the organic emitting layer 162 therebetween.

In addition, the bank 166 covering the edge of the first electrode 160 is formed at a boundary of the pixel region P.

Referring again to FIGS. 5 and 6, the dam 270 is spaced apart from the organic emitting diode D and includes a first dam 270a in the folding region FR and a second dam 270b in other region, e.g., an unfolding region. The first dam 270a has a thickness smaller than the second dam 270b.

For example, when the dam 270 is positioned at the same layer and is formed of the same material as the bank layer 166 (of FIG. 3), the first dam 270 has a first thickness t1 being smaller than the bank layer 166 and the second dam 270 has a second thickness t2 being greater than the first thickness t1 and being substantially equal to the bank layer 166.

Moreover, the encapsulation film 280, which may include the first inorganic layer 282, the organic layer 284 and the second inorganic layer 286, is formed to cover the organic emitting diode D and the dam 270.

The first and second inorganic layers 282 and 286 cover the organic emitting diode D and the dam 270, and the organic layer 284 is positioned inside the area surrounded by the dam 270. Namely, the organic layer 284 covers the organic emitting diode D and does not overlap the dam 270. In other words, the organic layer 284 has a width or a plane area being smaller than each of the first and second inorganic layers 282 and 286.

When the organic material is coated to form the organic layer 284, the coating process of the organic material is started at a starting line SL, which is defined with a pre-determined distance from the dam 270, and is ended at an ending line EL, which is defined with a pre-determined distance from the dam 270 at an opposite end. Namely, the coating process of the organic material is performed in an area surrounded by the dam 270.

Accordingly, even though the first dam 270 may have a relatively small thickness in the folding region FR, the flow of the organic material may be sufficiently blocked by the dam 270 such that the organic layer 284 is formed inside the area surrounded by the dam 270.

In addition, since the thickness of the first dam 270a in the folding region FR is reduced, the stress applied to the first and second inorganic layers 282 and 286 in the folding operation is decreased. As a result, the damages on the first and second inorganic layers 282 and 286 by the folding operation is minimized or prevented such that the decrease of the moisture barrier property of the encapsulation film 280 may be prevented.

When the thickness of the second dam 270b positioned along a direction of the C-C' line in FIG. 2 is small, the organic material may overflow the dam 270 such that the organic material may be coated on the edge of the flexible substrate 210. In this instance, the pad region (not shown) for electrical connection with an outer driving circuit may be covered by the organic material. Accordingly, it may be preferred that the second thickness t2 of the second dam 270b may be greater than the first thickness t1 of the first dam 270a.

Figure 7A:
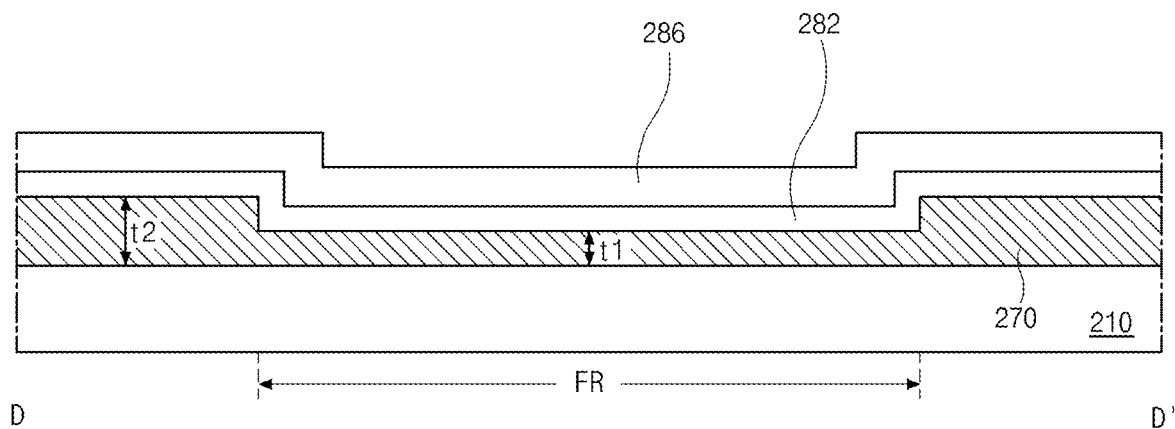
FIG. 7A is a cross-sectional view taken along the line D-D' of FIG. 2 and illustrating a flexible OLED device according to the second embodiment of the present invention.
Figure 7B:
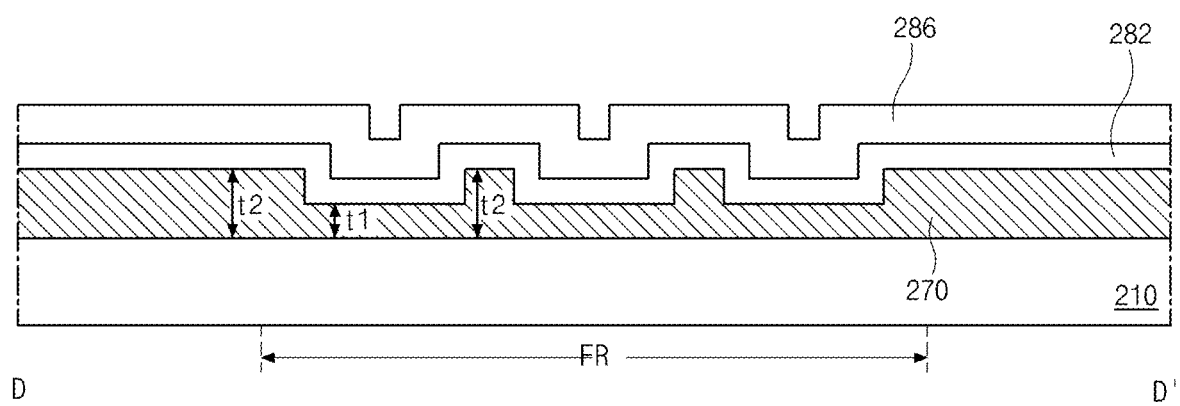
FIG. 7B is a cross-sectional view taken along the line D-D' of FIG. 2 and illustrating a flexible OLED device according to the second and third embodiments of the present invention.

FIG. 7A is a cross-sectional view taken along the line D-D' of FIG. 2 and illustrating a flexible OLED device according to the second embodiment. FIG. 7B is a cross-sectional view taken along the line D-D' of FIG. 2 and illustrating a flexible OLED device according to the second and third embodiments.

As shown in FIG. 7A the dam 270 may have uniform first thickness t1 in the folding region FR and may have uniform second thickness t2, which is greater than the first thickness t1, in the unfolding region.

Alternatively, as shown in FIG. 7B, the dam 270 may have an uneven surface in the folding region FR to include a first portion having the first thickness t1 and a second portion having the second thickness t2. Namely, the dam 270 in the folding region Fr may include a convex portion and/or a concave portion.

In FIG. 7B, the second portion, which is thicker, has the same thickness as the dam 270 in the unfolding region. Alternatively, the thickness of the second portion may be smaller than the dam 270 in the unfolding region.

Namely, in the present invention, an average thickness (=(t1+t2(of FIG. 7B))/2) of the first dam 270a in the folding region FR is smaller than an average thickness of the second dam 270b in the unfolding region such that the organic layer 284 is positioned inside the area surrounded by the dam 270 and the stress onto the encapsulation film 280 in the folding region by the folding operation is minimized or prevented.

Accordingly, in the flexible OLED device 200 in the second and third embodiments, by preventing the exposure of the side surface of the organic layer 284 and minimizing the folding stress on the encapsulation film 280, the damages on the organic emitting diode D is minimized or prevented.

Figure 8:
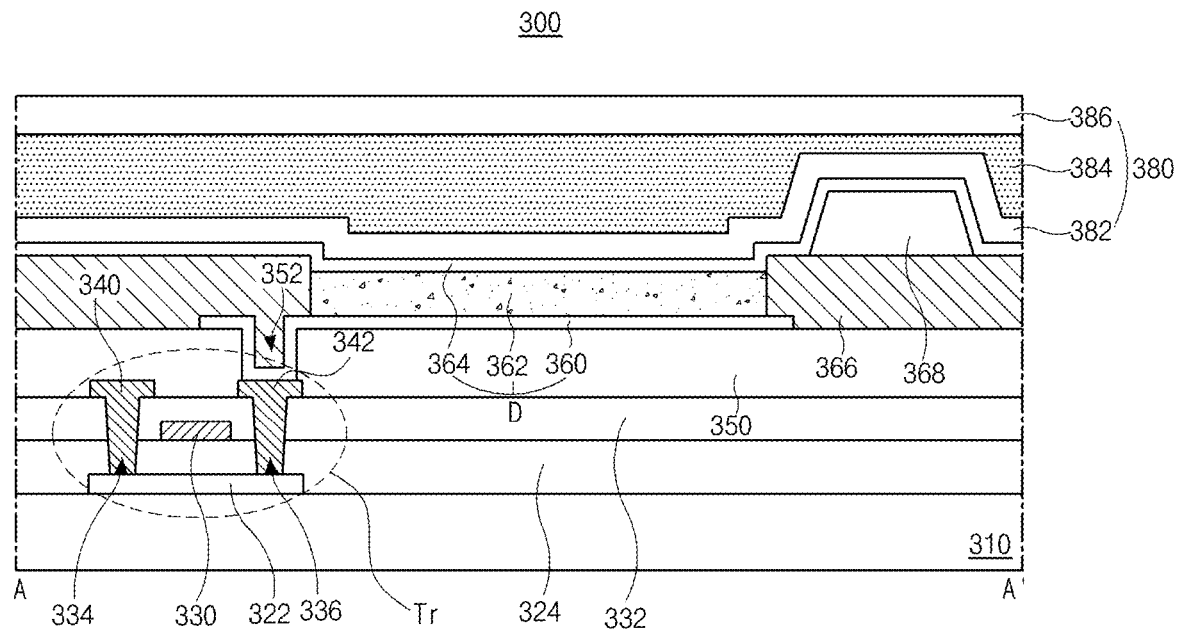
FIG. 8 is a cross-sectional view taken along the line A-A' of FIG. 2 and illustrating a flexible OLED device according to the fourth embodiment of the present invention.
Figure 9:
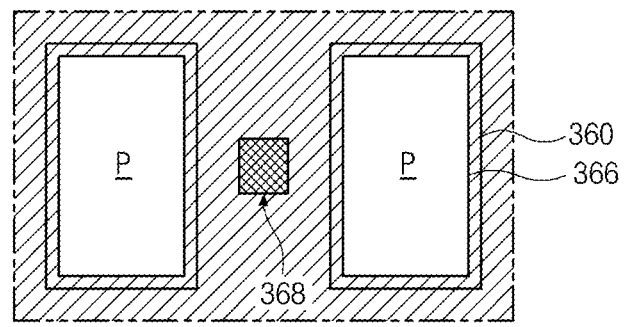
FIG. 9 is a plane view illustrating a position of a spacer in a flexible OLED device according to the fourth embodiment of the present invention.

FIG. 8 is a cross-sectional view taken along the line A-A' of FIG. 2 and illustrating a flexible OLED device according to the fourth embodiment. FIG. 9 is a plane view illustrating a position of a spacer in a flexible OLED device according to the fourth embodiment.

As shown in FIG. 8, the TFT Tr, the organic emitting diode D and the encapsulation film 380 are stacked over the flexible substrate 310.

For example, the flexible substrate 310 may be a substrate formed of a polymer, in particular, polyimide. For fabrication, a carrier substrate (not shown) may be attached to a lower surface of the flexible substrate 310, elements such as the TFT Tr may be formed on the flexible substrate 310, and the carrier substrate is released from the flexible substrate 310. Thus, the carrier substrate may facilitate fabrication of the TFT Tr.

The TFT Tr is formed on the flexible substrate 310. Although not shown, a buffer layer may be formed on the flexible substrate 310, and the TFT Tr may be formed on the buffer layer.

The semiconductor layer 322 is formed on the flexible substrate 310. The semiconductor layer 322 may include an oxide semiconductor material or polycrystalline silicon.

The gate insulating layer 324 is formed on the semiconductor layer 322. The gate insulating layer 324 may be formed of an inorganic insulating material such as silicon oxide or silicon nitride.

The gate electrode 330, which is formed of a conductive material, e.g., metal, is formed on the gate insulating layer 324 above a center of the semiconductor layer 322.

The interlayer insulating layer 332, which is formed of an insulating material, is formed on an entire surface of the flexible substrate 310 including the gate electrode 330. The interlayer insulating layer 332 may be formed of an inorganic insulating material, e.g., silicon oxide or silicon nitride, or an organic insulating material, e.g., benzocyclobutene or photo-acryl.

The interlayer insulating layer 332 includes first and second contact holes 334 and 336 exposing both sides of the semiconductor layer 322. The first and second contact holes 334 and 336 are positioned at both sides of the gate electrode 330 to be spaced apart from the gate electrode 330.

The source electrode 340 and the drain electrode 342, which are formed of a conductive material, e.g., metal, are formed on the interlayer insulating layer 332. The source electrode 340 and the drain electrode 342 are spaced apart from each other with respect to the gate electrode 330 and respectively contact both sides of the semiconductor layer 322 through the first and second contact holes 334 and 336.

The semiconductor layer 322, the gate electrode 330, the source electrode 340 and the drain electrode 342 constitute the TFT Tr, and the TFT Tr serves as a driving element.

Although not shown, a gate line and a data line are disposed on or over the flexible substrate 310 and cross each other to define a pixel region. In addition, a switching element, which is electrically connected to the gate line and the data line, may be disposed on the flexible substrate 310. The switching element is electrically connected to the TFT Tr as the driving element.

In addition, a power line, which is parallel to and spaced apart from the gate line or the data line, may be formed on or over the flexible substrate 310. Moreover, a storage capacitor for maintaining a voltage of the gate electrode 330 of the TFT Tr during one frame, may be further formed on the flexible substrate 310.

The passivation layer 350, which includes a drain contact hole 352 exposing the drain electrode 342 of the TFT Tr, is formed to cover the TFT Tr.

The first electrode 360, which is connected to the drain electrode 342 of the TFT Tr through the drain contact hole 352, is separately formed in each pixel region. The first electrode 360 may be an anode and may be formed of a conductive material having a relatively high work function. For example, the first electrode 360 may be formed of a transparent conductive material such as indium-tin-oxide (ITO) or indium-zinc-oxide (IZO).

The bank layer 366, which covers edges of the first electrode 360, is formed on the passivation layer 350. A center of the first electrode 360 in the pixel region is exposed through an opening of the bank layer 366.

A spacer 368 is formed on the bank layer 366.

Generally, when the organic emitting layer 362 of the organic emitting diode D is formed by a thermal vapor deposition process using a fine metal mask, the organic emitting diode D may be damaged by the fine metal mask. For example, the fine metal mask contacts the organic emitting layer 362 such that the organic emitting layer 362 may be damaged. Accordingly, with the spacer 368 on the bank layer 366, the damage of the organic emitting diode D by the fine metal mask is prevented.

The spacer 368 may be formed only on a portion of the bank layer 366. Namely, referring to FIG. 9, the bank layer 366 has one single body to completely surround the pixel region P, while the spacers 368 are separately formed on a portion of the bank layer 366. In other words, at least two spacers 368 are spaced apart from each other such that the other portions of the bank layer 366 are exposed.

For example, four spacers 268, which are spaced apart from each other, may be disposed at four sides of each pixel region P. The spacer 368 may be formed of polymer such as polyimide.

The organic emitting layer 362 is formed on the first electrode 360. The organic emitting layer 362 may have a single-layered structure of an emitting material layer formed of an emitting material. Alternatively, to improve emitting efficiency, the organic emitting layer 362 may have a multi-layered structure including a hole injection layer, a hole transporting layer, the emitting material layer, an electron transporting layer and an electron injection layer sequentially stacked on the first electrode 360.

The second electrode 364 is formed over the flexible substrate 310 including the organic emitting layer 362. The second electrode 364 is positioned at an entire surface of the display area AA. The second electrode 364 may be a cathode and may be formed of a conductive material having a relatively low work function. For example, the second electrode 364 may be formed of aluminum (Al), magnesium (Mg) or Al—Mg alloy.

The first electrode 360, the organic emitting layer 362 and the second electrode 364 constitute the organic emitting diode D.

The encapsulation film 380 is formed on the second electrode 384 of the organic emitting diode D to prevent penetration of moisture into the organic emitting diode D. The encapsulation film 380 may have has a triple-layered structure of a first inorganic layer 382, an organic layer 384 and a second inorganic layer 386. However, it is not limited thereto.

For example, the encapsulation film 380 may further include an organic layer on the second inorganic layer 386 or an organic layer and an inorganic layer stacked on the second inorganic layer 386.

The first inorganic layer 382 contacts and covers the organic emitting diode D. For example, the first inorganic layer 382 may be formed of one of silicon oxide (SiOx), silicon nitride (SiNx) and silicon-oxy-nitride (SiON).

The organic layer 384 is formed on the first inorganic layer 382, and the stress to the first inorganic layer 382 is reduced by the organic layer 384. For example, the organic layer 382 may be formed of an acryl-based material or an epoxy-based material.

The second inorganic layer 386 is formed on the organic layer 384 and may be formed of one of silicon oxide (SiOx), silicon nitride (SiNx) and silicon-oxy-nitride (SiON).

For example, each of the first and second inorganic layers 382 and 386 may be formed by a plasma enhanced chemical vapor deposition (PECVD) process or an atomic layer deposition (ALD) process, and the organic layer 384 may be formed by an inkjet coating process, a slit coating process or a bar coating process.

Although not shown, a barrier film may be attached to the encapsulation film 380, and a polarization plate for reducing an ambient light reflection may be attached to the barrier film. For example, the polarization plate may be a circular polarization plate.

Figure 10:
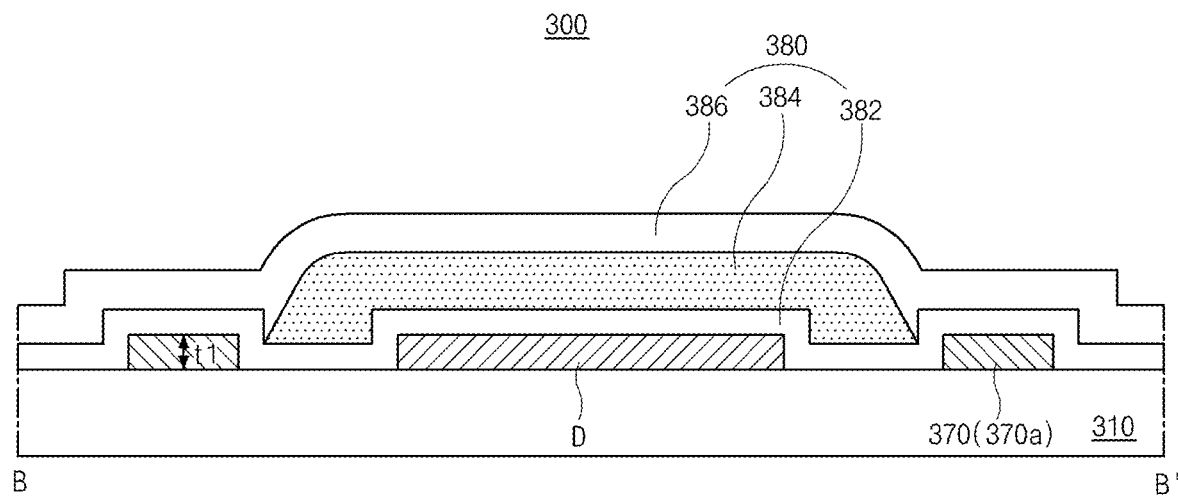
FIG. 10 is a cross-sectional view taken along the line B-B' of FIG. 2 and illustrating a flexible OLED device according to the fourth embodiment of the present invention.
Figure 11:
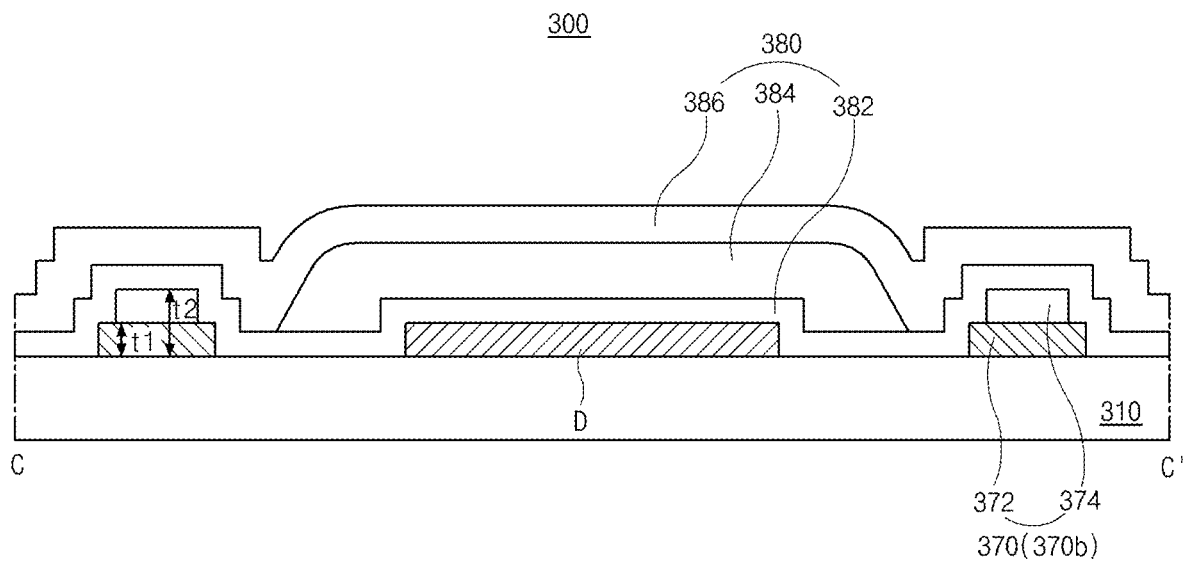
FIG. 11 is a cross-sectional view taken along the line C-C' of FIG. 2 and illustrating a flexible OLED device according to the fourth embodiment of the present invention.
Figure 12:
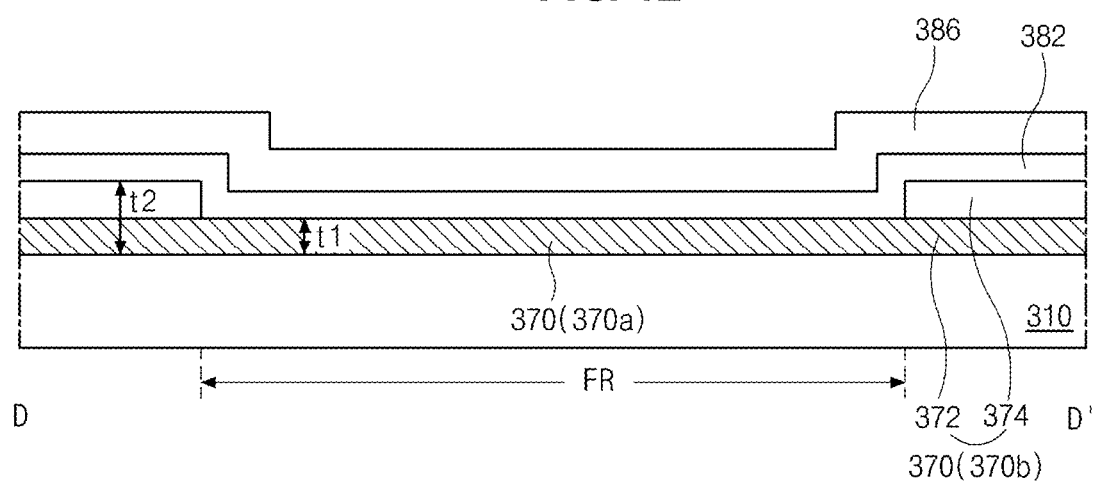
FIG. 12 is a cross-sectional view taken along the line D-D' of FIG. 2 and illustrating a flexible OLED device according to the fourth embodiment of the present invention.

FIG. 10 is a cross-sectional view taken along the line B-B' of FIG. 2 and illustrating a flexible OLED device according to the fourth embodiment. FIG. 11 is a cross-sectional view taken along the line C-C' of FIG. 2 and illustrating a flexible OLED device according to the fourth embodiment. FIG. 12 is a cross-sectional view taken along the line D-D' of FIG. 2 and illustrating a flexible OLED device according to the fourth embodiment.

As shown in FIGS. 10 and 11, the organic emitting diode D is formed in the display area AA of the flexible substrate 310, and the dam 370 surrounding the display area AA is formed in the non-display area NA of the flexible substrate 310.

For example, the dam 370 may be formed of an inorganic material, e.g., silicon oxide or silicon nitride, or an organic material, e.g., polyimide.

The dam 370 is positioned to be spaced apart from the organic emitting diode D. The dam 370 includes a first dam 370a of a single-layered structure in the folding region FR and a second dam 370b of a double-layered structure in the unfolding region, i.e., the other region except the folding region FR. The second dam 370b may include a lower layer 372 and an upper layer 374.

Namely, the first dam 370a has a first thickness t1, and the second dam 370b has a second thickness t2 being greater than the first thickness t1. The lower layer 372 of the second dam 370b may have substantially the same thickness as the first dam 370a.

The first dam 370a and the lower layer 372 of the second dam 370b may be positioned at the same layer and be formed of the same material as the bank layer 366 (of FIG. 8), and the upper layer 374 of the second dam 370b may be positioned at the same layer and be formed of the same material as the spacer 368 (of FIG. 8).

In FIG. 12, the first dam 370a in the folding region FR has the single-layered structure. Alternatively, dam patterns (not shown), which are spaced apart from each other, may be formed on the first dam 370a. The dam patterns may have a dot shape and be disposed at the same layer as the upper layer 374 of the second dam 370b.

In addition, the encapsulation film 380 is formed to cover the organic emitting diode D and the dam 370.

As mentioned above, the encapsulation film 380 may have has a triple-layered structure of a first inorganic layer 382, an organic layer 384 and a second inorganic layer 386.

Since the first dam 370a in the folding region FR has a single-layered structure, the first inorganic layer 382 in the folding region FR contacts an upper surface of the first dam 370a, which is disposed at the same layer as the bank layer 366, in the folding region FR. On the other hand, the first inorganic layer 382 in the unfolding region contacts an upper surface of the upper layer 374 of the second dam 370a, which is disposed at the same layer as the spacer 368.

In this instance, the first and second inorganic layers 382 and 386 cover the organic emitting diode D and the dam 370, and the organic layer 384 is positioned inside an area surrounded by the dam 370. Namely, the organic layer 384 covers and overlaps the organic emitting diode D and does not cover and overlap the dam 370. In other words, the organic layer 384 has a width and/or an area being smaller than each of the first and second inorganic layers 382 and 386.

As mentioned above, flow of the organic material, which is coated by a coating process, is sufficiently blocked by the dam 370 such that the organic layer 382 is formed inside the dam 370. Accordingly, the side surface of the organic layer 382 is not exposed.

In addition, since a thickness of the first dam 370a in the folding region FR is reduced, the stress applied to the first and second inorganic layers 382 and 386 during the folding operation may be decreased. Accordingly, the damages on the first and second inorganic layers 382 and 386 by the folding operation may be minimized or prevented such that the decrease of the moisture barrier property of the encapsulation film 380 may be prevented.

Namely, in the present invention, the average thickness of the first dam 370a in the folding region FR is smaller than the average thickness of the second dam 370b in the unfolding region and the organic layer 384 is positioned inside the area surrounded by the dam 370 such that the stress to the encapsulation film 380 in the folding region FR by the folding operation may be minimized or prevented.

Accordingly, in the flexible OLED device 300 according to the fourth embodiment, the exposure of the side surface of the organic layer 384 is prevented and the folding stress is minimized or prevented such that the damage on the organic emitting diode D is prevented.

Figure 13:
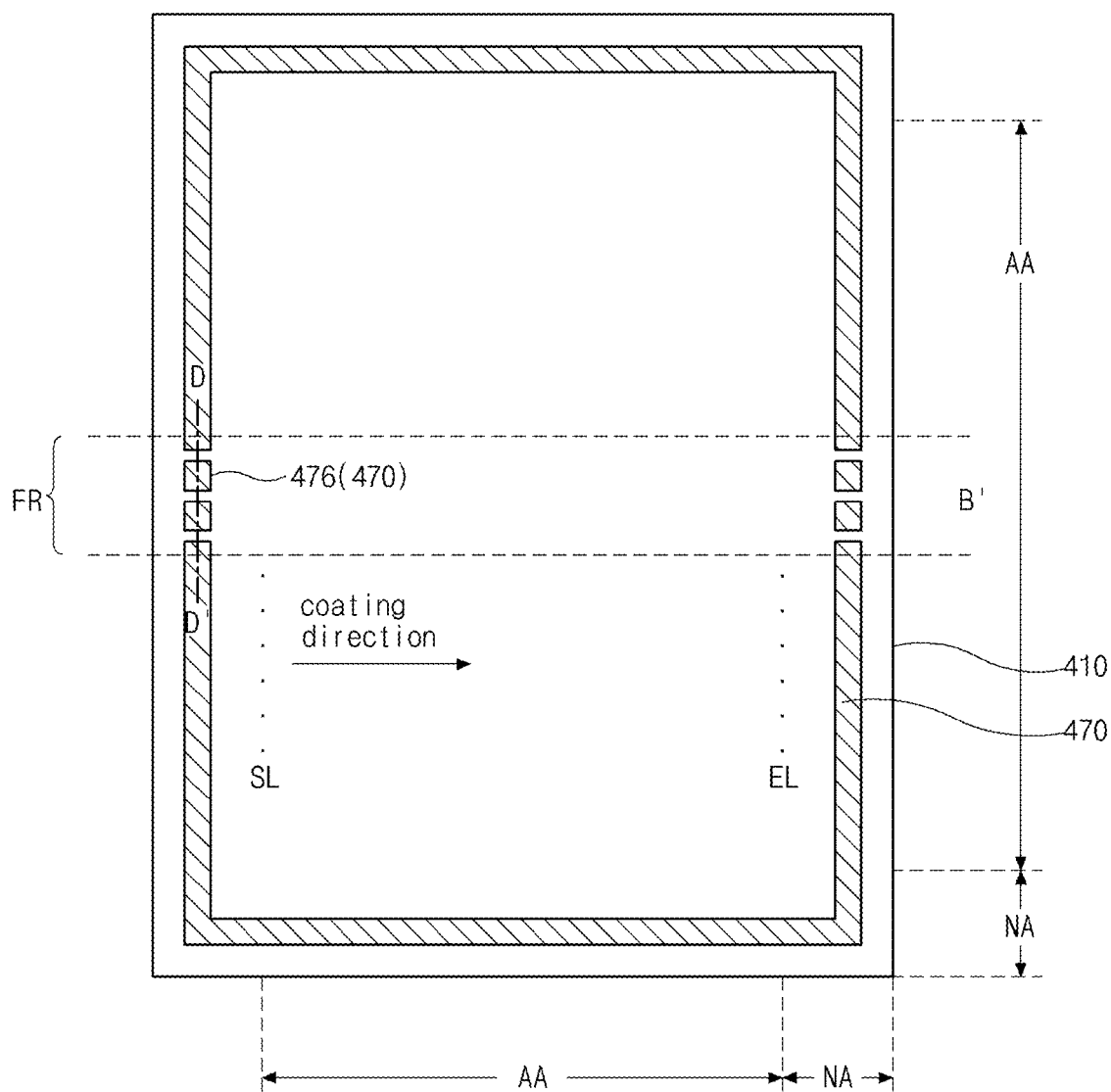
FIG. 13 is a plane view illustrating a flexible OLED device according to the fifth embodiment of the present invention.
Figure 14:
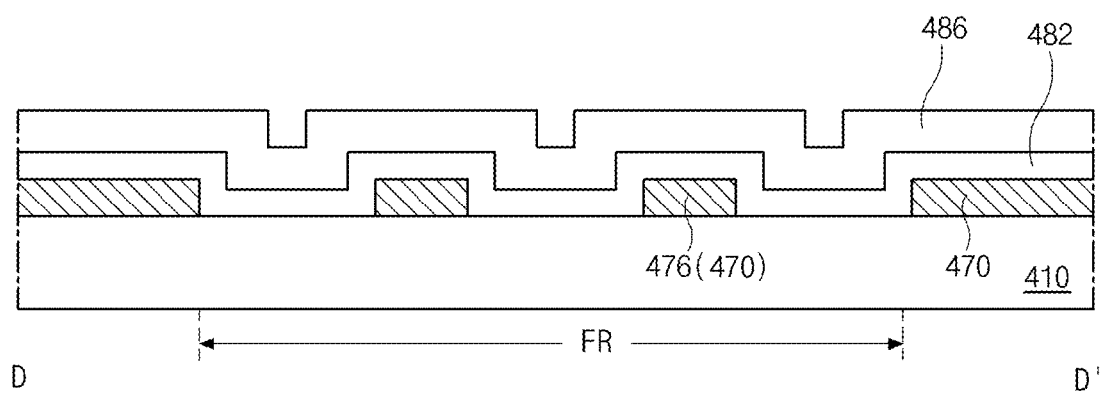
FIG. 14 is a cross-sectional view taken along the line D-D' of FIG. 13.

FIG. 13 is a plane view illustrating a flexible OLED device according to the fifth embodiment, and FIG. 14 is a cross-sectional view taken along the line D-D' of FIG. 13.

As shown in FIGS. 13 and 14, the OLED device 400 can be foldable, bendable or rollable. Namely, the OLED device 400 is a flexible display device. For example, the folding region FR is defined along a minor axis of the flexible OLED device 400. Alternatively, the folding region FR may be defined along a major axis of the flexible OLED device 400.

When the folding region FR is defined along the minor axis as shown in FIG. 13, a pad region (not shown) may be defined in at least one end of the major axis.

In the flexible OLED device 400, a plurality of pixel regions P are defined in a display area AA on the flexible substrate 400, and an organic emitting diode (not shown) is formed in each pixel region P.

As explained through FIG. 3, the TFT Tr including the semiconductor layer 122, the gate electrode 130, the source electrode 140 and the drain electrode 142 is formed on the flexible substrate 110, and the organic emitting diode D includes the first electrode 160, which is connected to the drain electrode 142 of the TFT Tr, the second electrode 164, which faces the first electrode 160, and the organic emitting layer 162 therebetween.

In addition, the bank 166 covering the edge of the first electrode 160 is formed at a boundary of the pixel region P. The spacer 368 (of FIG. 8) may be further formed on the bank layer 166.

The dam 470 covering the display area AA, where the organic emitting diode D is formed, is formed in the non-display area NA at a periphery of the display area AA.

The dam 470 is partially removed in the folding region FR such that at least one dam pattern 476, which has a dot shape and is spaced apart from the dam 470 in the non-folding region, is formed. Namely, the dam 470 is discontinuous.

FIG. 14 shows that each of the dam 470 and the dam pattern 476 has a single-layered structure. Alternatively, each of the dam 470 and the dam pattern 476 may have a double-layered structure being similar to the second dam 370b (of FIG. 12). On the other hand, the dam 470 may have a double-layered structure, while the dam pattern 476 may have a single-layered structure.

The encapsulation film 380 (of FIG. 12) is formed to cover the organic emitting diode D and the dam 470. The encapsulation film 380 may have has a triple-layered structure of a first inorganic layer 482, an organic layer 384 (of FIG. 10) and a second inorganic layer 486.

The first and second inorganic layers 482 and 486 cover the organic emitting diode D and the dam 470, and the organic layer 384 is positioned inside an area surrounded by the dam 470. Namely, the organic layer 384 covers and overlaps the organic emitting diode D and does not cover and overlap the dam 470. In other words, the organic layer 384 has a width and/or an area being smaller than each of the first and second inorganic layers 482 and 486.

As mentioned above, flow of the organic material, which is coated by a coating process, may be sufficiently blocked by the dam 470 such that the organic layer 382 is formed inside the dam 470. Accordingly, the side surface of the organic layer 382 may be not exposed.

In the flexible OLED device 400 according to the fifth embodiment, since the dam patterns 476 are disposed to be spaced apart from each other, an average thickness of the dam 470 in the folding region FR is reduced.

Namely, the thickness of the dam 470 in the folding region FR is reduce such that the stress applied to the first and second inorganic layers 482 and 486 by the folding operation is decreased. Accordingly, the damages on the first and second inorganic layers 482 and 486 by the folding operation may be minimized or prevented such that the decrease of the moisture barrier property of the encapsulation film 380 may be prevented.

In other words, in the present invention, the average thickness of the dam 470 in the folding region FR is smaller than the average thickness of the dam 470 in the unfolding region and the organic layer 384 is positioned inside the area surrounded by the dam 470 such that the stress to the encapsulation film 380 in the folding region FR by the folding operation is minimized or prevented.

Accordingly, in the flexible OLED device 400 according to the fifth embodiment, the exposure of the side surface of the organic layer 384 is prevented and the folding stress is minimized or prevented such that the damage on the organic emitting diode D is prevented.

Figure 15:
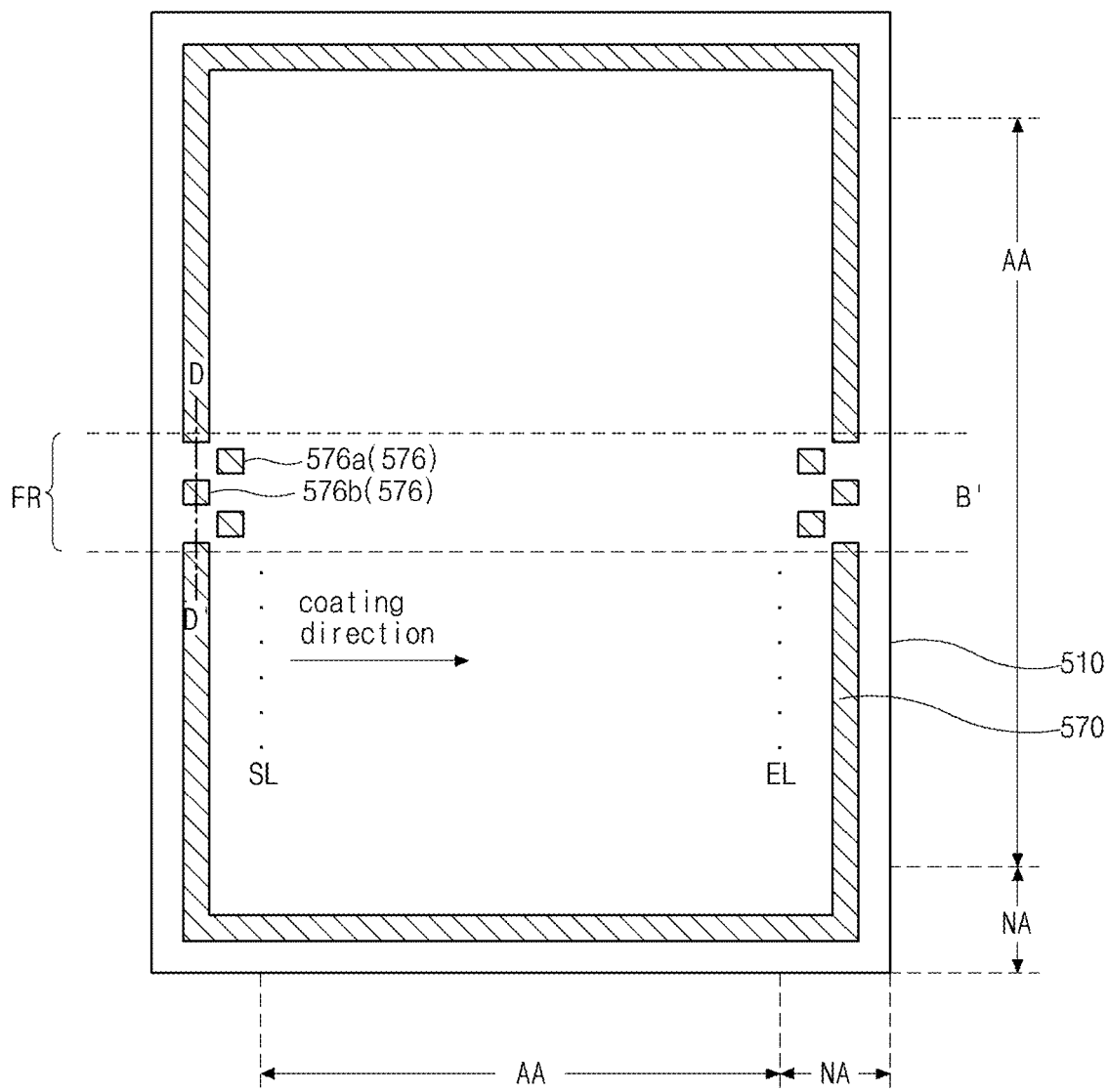
FIG. 15 is a plane view illustrating a flexible OLED device according to the sixth embodiment of the present invention.

FIG. 15 is a plane view illustrating a flexible OLED device according to the sixth embodiment.

As shown in FIG. 15, the OLED device 500 can be foldable, bendable or rollable. Namely, the OLED device 500 is a flexible display device. For example, the folding region FR is defined along a minor axis of the flexible OLED device 500. Alternatively, the folding region FR may be defined along a major axis of the flexible OLED device 500.

When the folding region FR is defined along the minor axis as shown in FIG. 15, a pad region (not shown) may be defined in at least one end of the major axis.

In the flexible OLED device 500, a plurality of pixel regions P are defined in a display area AA on the flexible substrate 500, and an organic emitting diode (not shown) is formed in each pixel region P.

As explained through FIG. 3, the TFT Tr including the semiconductor layer 122, the gate electrode 130, the source electrode 140 and the drain electrode 142 is formed on the flexible substrate 110, and the organic emitting diode D includes the first electrode 160, which is connected to the drain electrode 142 of the TFT Tr, the second electrode 164, which faces the first electrode 160, and the organic emitting layer 162 therebetween.

In addition, the bank 166 covering the edge of the first electrode 160 is formed at a boundary of the pixel region P. The spacer 368 (of FIG. 8) may be further formed on the bank layer 166.

The dam 570 covering the display area AA, where the organic emitting diode D is formed, is formed in the non-display area NA at a periphery of the display area AA.

The dam 570 is partially removed in the folding region FR such that first and second dam patterns 576a and 576b, each of which has a dot shape and is spaced apart from the dam 570 in the non-folding region, is formed. The first and second dams 576a and 576b are spaced apart from each other and arranged in a zigzag shape.

All of the dam 570, the first dam pattern 576a and the second dam pattern 576b have a single-layered structure or a double-layered structure. Alternatively, the dam 570 may have a double-layered structure, while the first and second dam patterns 576a and 576b may have a single-layered structure.

The encapsulation film 380 (of FIG. 12) is formed to cover the organic emitting diode D, the dam 570 and the dam pattern 576. The encapsulation film 380 may have has a triple-layered structure of a first inorganic layer 382 (of FIG. 10), an organic layer 384 (of FIG. 10) and a second inorganic layer 386 (of FIG. 10).

The first and second inorganic layers 382 and 386 cover the organic emitting diode D, the dam 570 and the dam pattern 576, and the organic layer 384 is positioned inside an area surrounded by the dam 570 and the dam pattern 576. Namely, the organic layer 384 covers and overlaps the organic emitting diode D and does not cover and overlap the dam 570 and the dam pattern 576.

As mentioned above, flow of the organic material, which is coated by a coating process, may be sufficiently blocked by the dam 570 and the dam pattern 576 such that the organic layer 382 is formed inside the dam 570 and the dam pattern 576. Accordingly, the side surface of the organic layer 382 is not exposed.

In the flexible OLED device 500 according to the sixth embodiment, since the dam patterns 576 including the first and second dam patterns 576a and 576b are disposed to be spaced apart from each other and arranged in the zigzag shape, an average thickness of the dam 570, i.e., the dam pattern 576, in the folding region FR is reduced.

Namely, the thickness of the dam 570 in the folding region FR is reduce such that the stress applied to the first and second inorganic layers 382 and 386 by the folding operation is decreased. Accordingly, the damages on the first and second inorganic layers 382 and 386 by the folding operation is minimized or prevented such that the decrease of the moisture barrier property of the encapsulation film 380 is prevented.

In other words, in the present invention, the average thickness of the dam 570 in the folding region FR is smaller than the average thickness of the dam 570 in the unfolding region and the organic layer 384 is positioned inside the area surrounded by the dam 570 such that the stress applied to the encapsulation film 380 in the folding region FR by the folding operation may be minimized or prevented.

Accordingly, in the flexible OLED device 500 according to the sixth embodiment, the exposure of the side surface of the organic layer 384 may be prevented and the folding stress is minimized or prevented such that the damage on the organic emitting diode D may be prevented.

What is claimed is:

1. A flexible organic light emitting display (OLED) device, comprising:
    a flexible substrate comprising:
        a display area;
        a non-display area at a periphery of the display area; and
        a folding region;
    at least one organic emitting diode on the flexible substrate in the display area;
    an encapsulation film covering the organic emitting diode; and
    a dam on the flexible substrate, the dam laterally surrounding the display area and comprising:
        a first dam in the folding region; and
        a second dam outside the folding region,
    wherein an average thickness of the first dam is smaller than the average thickness of the second dam,
    wherein the first dam and the second dam are on a same layer, and
    wherein the encapsulation film contacts an entire top surface of the first dam and an entire top surface of the second dam.

2. The flexible OLED device according to 1, wherein the encapsulation film comprises:
    a first inorganic layer;
    an organic layer on the first inorganic layer; and
    a second inorganic layer on the organic layer,
    wherein the dam laterally surrounds the organic layer, and
    wherein the first inorganic layer and the second inorganic layer cover the dam.

3. The flexible OLED device according to 1, wherein the first dam and the second dam have a constant thickness.

4. The flexible OLED device according to 1, wherein the first dam comprises a first portion having a first thickness, and a second portion having a second thickness,
    wherein the first thickness is smaller than the second thickness.

5. The flexible OLED device according to 4, wherein the first dam comprises one or both of: a convex portion and a concave portion.

6. The flexible OLED device of claim 4, wherein the second portion of the first dam has a same thickness as the second dam.

7. The flexible OLED device according to 4, wherein the second portion of the first dam has a smaller thickness than the second dam.

8. The flexible OLED device according to 1, wherein the first dam includes a single layer, and the second dam includes a lower layer and an upper layer.

9. The flexible OLED device according to 8, wherein the lower layer of the second dam and the first dam are in one continuous layer.

10. The flexible OLED device according to 8, further comprising:
    a bank layer surrounding each of a plurality of pixel regions defined in the display area; and
    at least one spacer on the bank layer,
    wherein the first dam is in a same layer as the bank layer,
    wherein the lower layer of the second dam is in the same layer as the bank layer, and
    wherein the upper layer of the second dam is in a same layer as the spacer.

11. The flexible OLED device according to 1, wherein the first dam continuously covers the flexible substrate.

12. The flexible OLED device according to 1, wherein the first dam is partially removed and comprises dam patterns configured to block flow of an organic material out of the display area.

13. The flexible OLED device according to 12, wherein the dam patterns comprise first dam patterns and second dam patterns spaced apart from each other and arranged in a zigzag shape.

14. The flexible OLED device according to 1, wherein the encapsulation film corresponding to the first dam has a first average height from the flexible substrate, and
    wherein the encapsulation film corresponding to the second dam has a second average height from the flexible substrate such that the second average height is greater than the first average height.

15. A method of fabricating a flexible organic light emitting display device, the method comprising:
    providing a flexible substrate comprising:
        providing a display area;
        providing a non-display area at a periphery of the display area; and
        providing a folding region;
    forming a dam surrounding the display area on the flexible substrate, the forming the dam comprising:
        providing a first dam in the folding region; and providing a second dam outside the folding region, an average thickness of the first dam being smaller than an average thickness of the second dam;
forming an emitting diode within the display area;
covering the display area and the non-display area with a first inorganic layer; and
covering the display area with an organic layer,
wherein a lower surface of the first dam and a lower surface of the second dam have a same height from the flexible substrate, and
wherein the encapsulation film contacts an entire top surface of the first dam and an entire top surface of the second dam.

16. The method according to 15, wherein the first dam comprises a first portion having a first thickness, and a second portion having a second thickness, and wherein the first thickness is smaller than the second thickness.

17. The method according to 16, wherein the second portion of the first dam has a same thickness as the second dam.

18. The method according to 16, wherein the second portion of the first dam has a smaller thickness than the second dam.

19. The method according to 15, wherein the first dam includes a single layer, and the second dam includes a lower layer and an upper layer.

20. The method according to 15, wherein the first dam is partially removed and comprises dam patterns configured to block flow of an organic material out of the display area.

* * * * *